(12) United States Patent
Lee et al.

(10) Patent No.: US 7,867,900 B2
(45) Date of Patent: Jan. 11, 2011

(54) ALUMINUM CONTACT INTEGRATION ON COBALT SILICIDE JUNCTION

(75) Inventors: Wei Ti Lee, San Jose, CA (US); Mohd Fadzli Anwar Hassan, Sunnyvale, CA (US); Ted Guo, Palo Alto, CA (US); Sang-Ho Yu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 12/240,816

(22) Filed: Sep. 29, 2008

(65) Prior Publication Data

US 2009/0087983 A1  Apr. 2, 2009

Related U.S. Application Data

(60) Provisional application No. 60/976,102, filed on Sep. 28, 2007.

(51) Int. Cl.
*H01L 21/44* (2006.01)
(52) U.S. Cl. ........................ 438/655; 427/252; 427/299; 438/656; 438/48
(58) Field of Classification Search ........................ None
See application file for complete search history.

(56) References Cited

U.S. PATENT DOCUMENTS

| | | | |
|---|---|---|---|
| 2,369,620 A | 2/1945 | Sullivan et al. | |
| 3,862,023 A | 1/1975 | Johnson | |
| 3,937,857 A | 2/1976 | Brummett et al. | |
| 4,006,047 A | 2/1977 | Brummett et al. | |
| 4,232,060 A | 11/1980 | Mallory, Jr. | |

(Continued)

FOREIGN PATENT DOCUMENTS

EP  0329406  8/1989

(Continued)

OTHER PUBLICATIONS

Dormans, et al. "OMCVD of cobalt and cobalt silicide," Journal of Crystal Growth 114, (1991), Elsevier Publishers B.V., pp. 364-372.

(Continued)

*Primary Examiner*—Ha Tran T Nguyen
*Assistant Examiner*—Shantanu C Pathak
(74) *Attorney, Agent, or Firm*—Patterson & Sheridan, LLP

(57) ABSTRACT

Embodiments herein provide methods for forming an aluminum contact on a cobalt silicide junction. In one embodiment, a method for forming materials on a substrate is provided which includes forming a cobalt silicide layer on a silicon-containing surface of the substrate during a silicidation process, forming a fluorinated sublimation film on the cobalt silicide layer during a plasma process, heating the substrate to a sublimation temperature to remove the fluorinated sublimation film, depositing a titanium-containing nucleation layer over the cobalt silicide layer, and depositing an aluminum-containing material over the titanium-containing nucleation layer. In one example, the method further provides forming the cobalt silicide layer by depositing a cobalt-containing layer on the silicon-containing surface, heating the substrate during a rapid thermal annealing (RTA) process, etching away any remaining portions of the cobalt-containing layer from the substrate, and subsequently heating the substrate during another RTA process.

5 Claims, 4 Drawing Sheets

U.S. PATENT DOCUMENTS

| | | | |
|---|---|---|---|
| 4,234,628 A | 11/1980 | DuRose | |
| 4,265,943 A | 5/1981 | Goldstein et al. | |
| 4,364,803 A | 12/1982 | Nidola et al. | |
| 4,368,223 A | 1/1983 | Kobayashi et al. | |
| 4,397,812 A | 8/1983 | Mallory, Jr. | |
| 4,632,857 A | 12/1986 | Mallory, Jr. | |
| 4,810,520 A | 3/1989 | Wu | |
| 4,985,372 A | 1/1991 | Narita et al. | |
| 5,089,441 A | 2/1992 | Moslehi | |
| 5,147,692 A | 9/1992 | Bengston | |
| 5,203,911 A | 4/1993 | Sricharoenchaikit et al. | |
| 5,235,139 A | 8/1993 | Bengston et al. | |
| 5,240,497 A | 8/1993 | Shacham et al. | |
| 5,248,527 A | 9/1993 | Uchida et al. | |
| 5,352,636 A | 10/1994 | Beinglass | |
| 5,380,560 A | 1/1995 | Kaja et al. | |
| 5,384,284 A | 1/1995 | Doan et al. | |
| 5,403,434 A | 4/1995 | Moslehi | |
| 5,415,890 A | 5/1995 | Kloiber et al. | |
| 5,478,462 A | 12/1995 | Walsh | |
| 5,510,216 A | 4/1996 | Calabrese et al. | |
| 5,648,125 A | 7/1997 | Cane | |
| 5,674,787 A | 10/1997 | Zhao et al. | |
| 5,695,810 A | 12/1997 | Dubin et al. | |
| 5,733,816 A | 3/1998 | Iyer et al. | |
| 5,755,859 A | 5/1998 | Brusic et al. | |
| 5,824,599 A | 10/1998 | Schacham-Diamand et al. | |
| 5,830,805 A | 11/1998 | Shacham-Diamand et al. | |
| 5,843,538 A | 12/1998 | Ehrsam et al. | |
| 5,846,598 A | 12/1998 | Semkow et al. | |
| 5,877,087 A * | 3/1999 | Mosely et al. | 438/656 |
| 5,885,749 A | 3/1999 | Huggins et al. | |
| 5,891,513 A | 4/1999 | Dubin et al. | |
| 5,899,752 A | 5/1999 | Hey et al. | |
| 5,904,827 A | 5/1999 | Reynolds | |
| 5,907,790 A | 5/1999 | Kellam | |
| 5,910,340 A | 6/1999 | Uchida et al. | |
| 5,913,147 A | 6/1999 | Dubin et al. | |
| 5,932,077 A | 8/1999 | Reynolds | |
| 5,933,757 A | 8/1999 | Yoshikawa et al. | |
| 5,969,422 A | 10/1999 | Ting et al. | |
| 6,010,962 A | 1/2000 | Liu et al. | |
| 6,015,724 A | 1/2000 | Yamazaki et al. | |
| 6,015,747 A | 1/2000 | Lopatin et al. | |
| 6,065,424 A | 5/2000 | Shacham-Diamand et al. | |
| 6,077,780 A | 6/2000 | Dubin | |
| 6,107,199 A | 8/2000 | Allen et al. | |
| 6,110,011 A | 8/2000 | Somekh et al. | |
| 6,110,530 A | 8/2000 | Chen et al. | |
| 6,113,771 A | 9/2000 | Landau et al. | |
| 6,136,163 A | 10/2000 | Cheung et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,153,935 A | 11/2000 | Edelstein et al. | |
| 6,165,912 A | 12/2000 | McConnell et al. | |
| 6,171,661 B1 | 1/2001 | Zheng et al. | |
| 6,174,812 B1 | 1/2001 | Hsiung et al. | |
| 6,180,523 B1 | 1/2001 | Lee et al. | |
| 6,197,181 B1 | 3/2001 | Chen | |
| 6,197,364 B1 | 3/2001 | Paunovic et al. | |
| 6,197,688 B1 | 3/2001 | Simpson | |
| 6,203,613 B1 | 3/2001 | Gates et al. | |
| 6,228,233 B1 | 5/2001 | Lakshmikanthan et al. | |
| 6,242,349 B1 | 6/2001 | Nogami et al. | |
| 6,245,670 B1 | 6/2001 | Cheung et al. | |
| 6,251,236 B1 | 6/2001 | Stevens | |
| 6,258,220 B1 | 7/2001 | Dordi et al. | |
| 6,258,223 B1 | 7/2001 | Cheung et al. | |
| 6,258,270 B1 | 7/2001 | Hilgendorff et al. | |
| 6,261,637 B1 | 7/2001 | Oberle | |
| 6,291,348 B1 | 9/2001 | Lopatin et al. |
| 6,294,836 B1 | 9/2001 | Paranjpe et al. |
| 6,303,809 B1 | 10/2001 | Chi et al. |
| 6,319,387 B1 | 11/2001 | Krishnamoorthy et al. |
| 6,323,128 B1 | 11/2001 | Sambucetti et al. |
| 6,333,275 B1 | 12/2001 | Mayer et al. |
| 6,342,733 B1 | 1/2002 | Hu et al. |
| 6,344,410 B1 | 2/2002 | Lopatin et al. |
| 6,346,477 B1 | 2/2002 | Kaloyeros et al. |
| 6,365,502 B1 | 4/2002 | Paranjpe et al. |
| 6,416,647 B1 | 7/2002 | Dordi et al. |
| 6,432,819 B1 | 8/2002 | Pavate et al. |
| 6,436,267 B1 | 8/2002 | Carl et al. |
| 6,436,816 B1 | 8/2002 | Lee et al. |
| 6,441,492 B1 | 8/2002 | Cunningham |
| 6,444,263 B1 | 9/2002 | Paranjpe et al. |
| 6,482,740 B2 | 11/2002 | Soininen et al. |
| 6,488,984 B1 | 12/2002 | Wada et al. |
| 6,494,959 B1 | 12/2002 | Samoilov et al. |
| 6,516,815 B1 | 2/2003 | Stevens et al. |
| 6,527,855 B2 | 3/2003 | DelaRosa et al. |
| 6,528,409 B1 | 3/2003 | Lopatin et al. |
| 6,551,488 B1 | 4/2003 | Hey et al. |
| 6,555,909 B1 | 4/2003 | Lopatin et al. |
| 6,565,729 B2 | 5/2003 | Chen et al. |
| 6,573,606 B2 | 6/2003 | Sambucetti et al. |
| 6,605,874 B2 | 8/2003 | Leu et al. |
| 6,616,967 B1 | 9/2003 | Test |
| 6,627,995 B2 | 9/2003 | Paranjpe et al. |
| 6,645,550 B1 | 11/2003 | Cheung et al. |
| 6,645,847 B2 | 11/2003 | Paranjpe et al. |
| 6,717,189 B2 | 4/2004 | Inoue et al. |
| 6,740,585 B2 | 5/2004 | Yoon et al. |
| 6,743,473 B1 | 6/2004 | Parkhe et al. |
| 6,770,565 B2 | 8/2004 | Olgado et al. |
| 6,800,830 B2 | 10/2004 | Mahawili |
| 6,808,564 B2 | 10/2004 | Dietze |
| 6,812,126 B1 | 11/2004 | Paranjpe et al. |
| 6,821,909 B2 | 11/2004 | Ramanathan et al. |
| 6,861,356 B2 | 3/2005 | Matsuse et al. |
| 6,911,401 B2 | 6/2005 | Khandan et al. |
| 6,936,528 B2 | 8/2005 | Koo et al. |
| 6,958,286 B2 | 10/2005 | Chen et al. |
| 6,974,768 B1 | 12/2005 | Kailasam |
| 7,211,506 B2 | 5/2007 | Moon et al |
| 7,265,048 B2 | 9/2007 | Chung et al. |
| 7,341,633 B2 | 3/2008 | Lubomirsky et al. |
| 7,396,480 B2 | 7/2008 | Kao et al. |
| 7,465,358 B2 | 12/2008 | Weidman et al. |
| 2001/0030366 A1 | 10/2001 | Nakano et al. |
| 2002/0004293 A1 | 1/2002 | Soininen et al. |
| 2002/0036143 A1 | 3/2002 | Segawa et al. |
| 2002/0076837 A1 | 6/2002 | Hujanen et al. |
| 2002/0081381 A1 | 6/2002 | DelaRosa et al. |
| 2002/0098681 A1 | 7/2002 | Hu et al. |
| 2002/0155648 A1 | 10/2002 | Ashjaee et al. |
| 2002/0197856 A1 | 12/2002 | Matsuse et al. |
| 2003/0010645 A1 | 1/2003 | Ting et al. |
| 2003/0022487 A1 | 1/2003 | Yoon et al. |
| 2003/0029715 A1 | 2/2003 | Yu et al. |
| 2003/0075808 A1 | 4/2003 | Inoue et al. |
| 2003/0098125 A1 | 5/2003 | An |
| 2003/0116439 A1 | 6/2003 | Seo et al. |
| 2003/0181040 A1 | 9/2003 | Ivanov et al. |
| 2003/0190426 A1 | 10/2003 | Padhi et al. |
| 2003/0190812 A1 | 10/2003 | Padhi et al. |
| 2004/0013858 A1 | 1/2004 | Hacker et al. |
| 2004/0045837 A1 | 3/2004 | Yoshida et al. |
| 2004/0077158 A1 | 4/2004 | Um et al. |
| 2004/0105934 A1 | 6/2004 | Chang et al. |
| 2004/0132295 A1 | 7/2004 | Basol et al. |
| 2004/0137161 A1 | 7/2004 | Segawa et al. |
| 2004/0154535 A1 | 8/2004 | Chen et al. |

| | | | |
|---|---|---|---|
| 2004/0194799 | A1 | 10/2004 | Kim et al. |
| 2004/0203233 | A1 | 10/2004 | Kang et al. |
| 2004/0211665 | A1 | 10/2004 | Yoon et al. |
| 2004/0241321 | A1 | 12/2004 | Ganguli et al. |
| 2005/0020077 | A1 | 1/2005 | Zheng et al. |
| 2005/0085031 | A1 | 4/2005 | Lopatin et al. |
| 2005/0196960 | A1 | 9/2005 | Koo et al. |
| 2005/0199489 | A1 | 9/2005 | Stevens et al. |
| 2005/0218507 | A1 | 10/2005 | Kao et al. |
| 2005/0220998 | A1 | 10/2005 | Chang et al. |
| 2005/0230350 | A1 | 10/2005 | Kao et al. |
| 2006/0033678 | A1 | 2/2006 | Lubomirsky et al. |
| 2006/0051966 | A1 | 3/2006 | Or et al. |
| 2006/0153973 | A1 | 7/2006 | Chang et al. |
| 2006/0199372 | A1 | 9/2006 | Chung et al. |
| 2006/0246217 | A1 | 11/2006 | Weidman et al. |
| 2006/0251800 | A1 | 11/2006 | Weidman et al. |
| 2006/0251801 | A1 | 11/2006 | Weidman et al. |
| 2006/0252252 | A1 | 11/2006 | Zhu et al. |
| 2006/0264043 | A1 | 11/2006 | Stewart et al. |
| 2006/0276020 | A1 | 12/2006 | Yoon et al. |
| 2007/0071888 | A1 | 3/2007 | Shanmugasundram et al. |
| 2007/0111359 | A1* | 5/2007 | Uchida et al. ............... 438/48 |
| 2007/0111519 | A1 | 5/2007 | Lubomirsky et al. |
| 2007/0119370 | A1 | 5/2007 | Ma et al. |
| 2007/0119371 | A1 | 5/2007 | Ma et al. |
| 2007/0123051 | A1 | 5/2007 | Arghavani et al. |
| 2007/0128862 | A1 | 6/2007 | Ma et al. |
| 2007/0128863 | A1 | 6/2007 | Ma et al. |
| 2007/0128864 | A1 | 6/2007 | Ma et al. |
| 2007/0181057 | A1 | 8/2007 | Lam et al. |
| 2007/0202254 | A1* | 8/2007 | Ganguli et al. ............. 427/252 |
| 2008/0135914 | A1 | 6/2008 | Krishna et al. |
| 2008/0160210 | A1 | 7/2008 | Yang et al. |
| 2008/0268635 | A1 | 10/2008 | Yu et al. |
| 2008/0268645 | A1 | 10/2008 | Kao et al. |
| 2009/0004850 | A1 | 1/2009 | Ganguli et al. |

FOREIGN PATENT DOCUMENTS

| | | |
|---|---|---|
| EP | 0475567 | 3/1992 |
| EP | 0913498 | 5/1999 |
| EP | 1496542 | 1/2005 |
| EP | 1568797 | 8/2005 |
| GB | 2285174 | 6/1995 |
| JP | 02256235 | 10/1990 |
| JP | 7297543 | 11/1995 |
| JP | 11124682 | 5/1999 |
| WO | WO-9954920 | 10/1999 |
| WO | WO-02083981 | 10/2002 |
| WO | WO-03014416 | 2/2003 |
| WO | WO-2005036615 | 4/2005 |

OTHER PUBLICATIONS

Eze "Electroless deposition of CoO thin films," J. Phys. D: Appl. Phys. 32 (1999), pp. 533-540.

Eze, et al. "Chemical-bath-deposited cobalt sulphide films: preparation effects," Materials Chemistry and Physics, 47 (1997), pp. 31-36.

Froment, et al. "Nickel vs. Cobalt silicide integration for sub-50-nm CMOS," European Solid-State Device Research, 2003. ESSDERC '03. 33$^{rd}$ Conference on Sep. 16-18, 2003, pp. 215-218.

Hu, et al. "Reduced Electromigration of Cu Wires by Surface Coating" Applied Physics Letters, vol. 81, No. 10, Sep. 2, 2002, pp. 1782-1784.

Kim, et al. "Investigation of Chemical Vapor Deposition (CVD)—Derived Cobalt Silicidation for the Improvement of Contact Resistance," Japanese Journal of Applied Physics, vol. 44, No. 6A, 2005, pp. 3828-3831.

Lavoie, et al. "Effects of Alloying Elements on Cobalt Silicide Formation," NSLS Activity Report, Science Highlights, 2001, pp. 2-16-2-20.

Lavoie, et al. "Nickel silicide technology," Silicide Technol. Intergr. Circuits, 2004, pp. 95-151.

Lim, et al. "Atomic layer deposition of transition metals," Nature Materials, vol. 2, Nov. 2003, pp. 749-754.

Lin, et al. "Manufacturing of Cu/Electroless Nickel/Sn-Pb Flip Chip Solder Bumps," IEEE Transactions on Advanced Packaging, vol. 22, No. 4, Nov. 1999, pp. 575-579.

Lopatin, et al. "Thin Electroless barrier for copper films," Part of the SPIE Conference of Multilevel Interconnect technology II, SPIE vol. 3508 (1998), pp. 65-77.

PCT International Search Report and Written Opinion dated Jun. 24, 2008 for International Application No. PCT/US2006/29137.

Pearlstein "Electroless Plating," J. Res. Natl. Bur. Stan., Ch. 31 (1963), pp. 710-747.

Saito, et al. "Electroless deposition of Ni-B, Co-B and Ni-Co-B alloys using dimethylamineborane as a reducing agent," Journal of Applied Electrochemistry 28 (1998), pp. 559-563.

Shacham-Diamond, et al. "Electrochemically deposited thin film alloys for ULSI and MEMS applications," Microelectronic Engineering 50 (2000), pp. 525-531.

Shacham-Diamond, et al. "High Aspect Ratio Quarter-Micron Electroless Copper Integrated Technology", Microelectronic Engineering 37/38, (1997), pp. 77-88.

Shacham-Diamond, et al. "Material properties of electroless 100-200 nm thick CoWP films," Electrochemical Society Proceedings, vol. 99-34, pp. 102-110, (1999).

The Chinese Journal of Nonferrous Metals, vol. 10, No. 1, Feb. 2, 2000, Abstract included.

Yun, et al. "Highly Scalable PVD/CVD-Cobalt Bilayer Salicidation Technology for sub-50nm CMOSFETs," 207$^{th}$ ECS Meeting—Quebec City, Canada, May 15-20, 2005.

* cited by examiner

ALUMINUM CONTACT INTEGRATION ON COBALT SILICIDE JUNCTION

CROSS-REFERENCE TO RELATED APPLICATION

This application claims benefit of U.S. Ser. No. 60/976,102 (APPM/011818L), filed Sep. 28, 2007, which is herein incorporated by reference in its entirety.

BACKGROUND OF THE INVENTION

1. Field of the Invention

Embodiments of the invention generally relate to semiconductor and electronic manufacturing processes, more particularly, to a process for forming a metal contact on a silicide junction on a substrate.

2. Description of the Related Art

Metal contacts are frequently formed on semiconductor devices to integrate them into electrical circuits. In a typical semiconductor device, such as a Metal Oxide Silicon Field Effect Transistor (MOSFET), metal contacts may be formed on the gate structure, and on the source and drain junctions. These contacts must be electrically coupled to the metal oxide layer of the gate structure, and to the amorphous silicon region of the source and drain junctions, for the device to function.

Aluminum metal has been used for the contacts due to its low electrical resistivity. As device geometry shrinks, however, the tendency of silicon and aluminum to diffuse through each other degrades electrical properties of the smaller devices. Tungsten is frequently used for contacts in small devices because it is resistant to diffusion with silicon. Resistivity of tungsten is nearly twice that of aluminum, however, and the smaller devices of the future will require lower resistivity materials. Barrier films such as silicon carbides, silicon nitrides, metal nitrides, and silicon oxynitrides, may be used to reduce diffusion at layer interfaces, but they also increase resistivity at those interfaces. Use of barrier layers also reduces the size of contact holes, resulting in smaller contact size and further increased resistivity.

Thus, there is a need for a method of integrating a conductive contact with a cobalt silicide region of a semiconductor device with low resistivity and low diffusion of impurities into the metal contact.

SUMMARY OF THE INVENTION

Embodiments of the invention generally provide a method for integrating a metal contact with a cobalt silicide region of a semiconductor device. In one embodiment, a method for depositing materials on a substrate is provided which includes forming a cobalt silicide layer on a silicon-containing surface of the substrate during a silicidation process, forming a fluorinated sublimation film on the cobalt silicide layer during a plasma process, and heating the substrate to a sublimation temperature to remove the fluorinated sublimation film. Subsequently, the method further provides depositing a titanium-containing nucleation layer on the cobalt silicide layer and depositing an aluminum material on the titanium-containing nucleation layer.

In some embodiments, the cobalt silicide layer may be formed during a silicidation process. Alternatively, the cobalt silicide layer may be formed during a chemical vapor deposition (CVD) process, an atomic layer deposition (ALD) process, or a physical vapor deposition (PVD) process. In one example, the cobalt silicide layer may be formed by depositing a cobalt-containing layer on the silicon-containing surface of the substrate during a PVD process and heating the substrate to a first temperature to form cobalt silicide during a first rapid thermal annealing (RTA) process. Subsequently, the method further provides removing any remaining portions of the cobalt-containing layer from the substrate during an etching process and heating the substrate to a second temperature during a second RTA process. The cobalt silicide layer may have a thickness of about 550 Å or less.

In another embodiment, the method further provides optionally depositing a capping layer over the cobalt-containing layer prior to the first RTA process. The capping layer may have a thickness of about 200 Å or less, such as about 100 Å or less.

In another example, the fluorinated sublimation film may be formed during the plasma process by exposing the cobalt silicide layer to a nitrogen-containing gas and a fluorine-containing gas, applying RF power to the nitrogen-containing gas and the fluorine-containing gas to ignite a plasma, and exposing the cobalt silicide layer to the plasma while forming the fluorinated sublimation film. In another example, the plasma clean process includes forming a gaseous mixture containing the nitrogen-containing gas and the fluorine-containing gas within a processing chamber, applying an electric field to the gaseous mixture to form a plasma, and exposing the cobalt silicide layer to the plasma while forming a fluorinated sublimation film. Subsequently, the substrate may be heated to remove the fluorinated sublimation film.

In another example, the titanium-containing nucleation layer may be deposited on the cobalt silicide layer by depositing a metallic titanium layer on the cobalt silicide layer during a vapor deposition process, depositing a first titanium nitride layer on the metallic titanium layer during a first CVD process, exposing the first titanium nitride layer to a first inert gas plasma, depositing a second titanium nitride layer on the first titanium nitride layer during a second CVD process, and exposing the second titanium nitride layer to a second inert gas plasma. The metallic titanium layer may have a thickness of about 50 Å or less. Also, the first and second titanium nitride layers may independently each have a thickness of about 50 Å or less. Therefore, the titanium-containing nucleation layer may have a thickness of about 150 Å or less. In some examples, the titanium-containing nucleation layer may contain a metallic titanium layer, a titanium nitride layer, or a bilayer of metallic titanium and titanium nitride.

In another embodiment, a method for depositing materials on a substrate is provided which includes exposing a substrate to a plasma while forming a fluorinated sublimation film thereon, heating the substrate under a heated distribution plate to substantially sublime the fluorinated sublimation film from the substrate, forming a titanium-containing nucleation layer over the substrate, forming an aluminum seed layer over the titanium-containing nucleation layer during a vapor deposition process, and forming an aluminum bulk layer over the aluminum seed layer during a PVD process.

In another embodiment, a method for depositing materials on a substrate is provided which includes forming a cobalt silicide layer on a silicon-surface of the substrate, forming a fluorinated sublimation film on the cobalt silicide layer during the plasma cleaning process, heating the substrate to sublime the fluorinated sublimation film depositing a titanium-containing nucleation layer over the cobalt silicide layer during a first PVD process, depositing an aluminum seed layer over the titanium-containing nucleation layer during a CVD process, and depositing an aluminum bulk layer over the aluminum seed layer during a second PVD process.

In some examples, the aluminum material may be deposited over the titanium-containing nucleation layer by depositing a first aluminum-containing layer over the titanium-containing nucleation layer during a CVD process, and depositing a second aluminum-containing layer over the first aluminum-containing layer during a PVD process. The first aluminum-containing layer may be deposited by exposing the substrate to an organic-metallic aluminum precursor during the CVD process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method for integrating a metal contact into a cobalt suicide region of a semiconductor device. One or more cobalt silicide regions are formed on a silicon-containing surface of a substrate. The substrate is then cleaned using a plasma process to remove surface impurities. A nucleation layer may be formed on the clean substrate. A metal contact may then be formed on the substrate. Aluminum may be used for the metal contact in this process without using a barrier layer. Not intending to be bound by theory, it has been discovered that a cobalt silicide region prepared according to embodiments described herein has sufficient barrier properties to prevent diffusion of silicon, or any other impurities, into the aluminum, without use of a resistive barrier layer.

Figure 1:
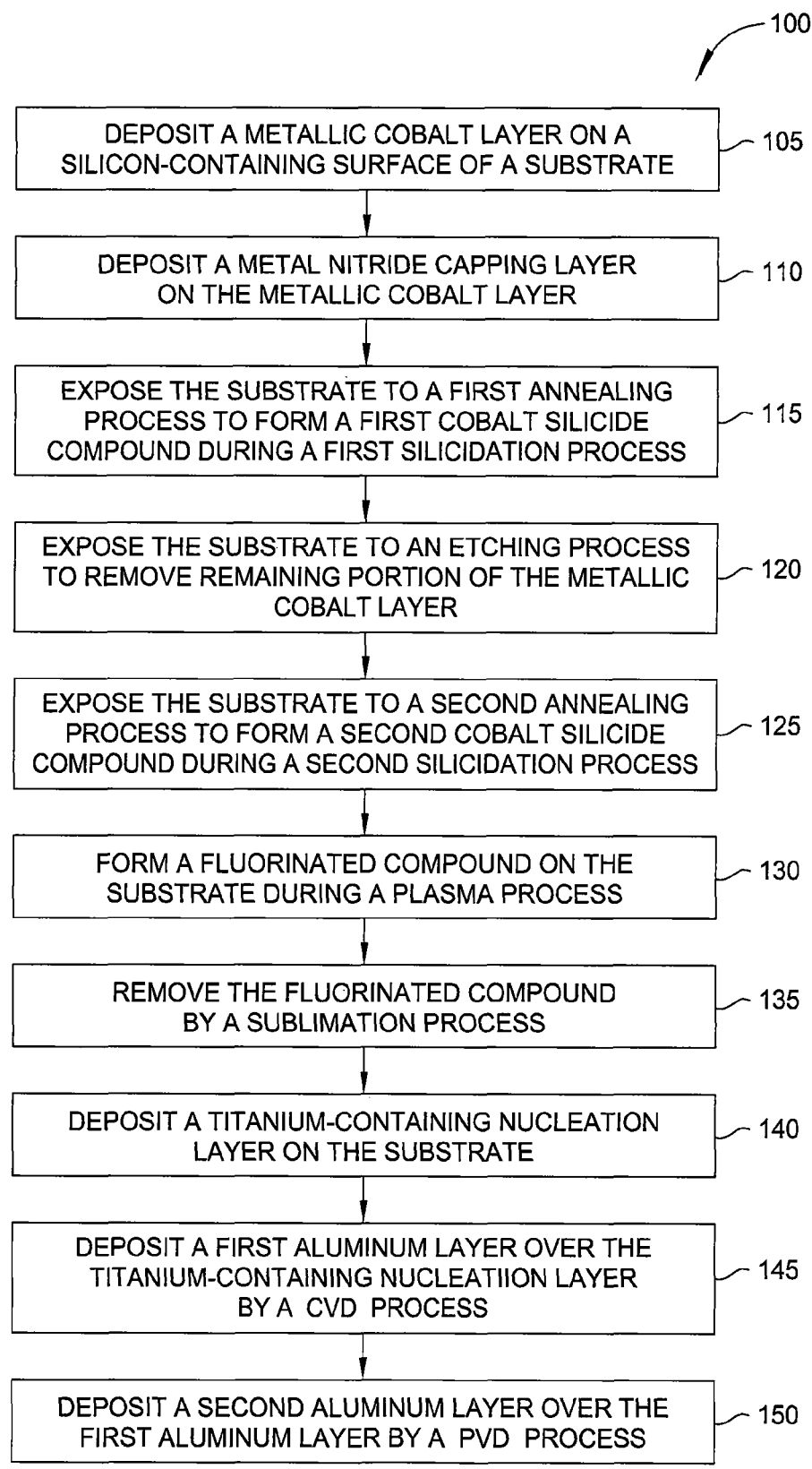
FIG. 1 depicts a flow chart of a process according to an embodiment described herein.

In one embodiment, a metal contact junction may be formed by using process 100, depicted in a flow chart by FIG. 1. In step 105, a metallic cobalt layer is deposited on a silicon-containing surface of a substrate. The metallic cobalt layer may be deposited by a process, such as atomic layer deposition (ALD), plasma enhanced ALD (PE-ALD), chemical vapor deposition (CVD), plasma enhanced CVD (PE-CVD), pulsed-CVD, or physical vapor deposition (PVD). The metallic cobalt layer may be deposited having a thickness within a range from about 50 Å to about 500 Å, preferably, from about 75 Å to about 300 Å, and more preferably, from about 100 Å to about 200 Å, such as about 150 Å. In one example, the metallic cobalt layer is deposited to a thickness of about 150 Å during a PVD process. In another example, the metallic cobalt layer is deposited to a thickness of about 125 Å during an ALD process.

In step 110, a metal nitride layer, such as a titanium nitride capping layer, may be deposited on the metallic cobalt layer. Instead of titanium nitride, the metal nitride layer may contain tantalum nitride, tungsten nitride, suicides thereof, borides thereof, derivates thereof, or combinations thereof. The metal nitride layer may be deposited by a process, such as ALD, PE-ALD, CVD, PE-CVD, or PVD. The metal nitride layer may be deposited having a thickness within a range from about 10 Å to about 300 Å, preferably, from about 25 Å to about 200 Å, and more preferably, from about 50 Å to about 150 Å, such as about 100 Å. In one example, the metal nitride layer containing titanium nitride is deposited to a thickness of about 100 Å during a PVD process. In another example, the metal nitride layer containing tantalum nitride is deposited to a thickness of about 25 Å during an ALD process. In another example, the metal nitride layer containing tungsten nitride is deposited to a thickness of about 75 Å during an ALD process. In other embodiments, the metal nitride layer may contain multiple layers, such as a bilayer of metallic tantalum and tantalum nitride, a bilayer of metallic titanium and titanium nitride, or a bilayer of metallic tungsten and tungsten nitride. In one example, the metal nitride layer contains a tantalum/tantalum nitride bilayer or a titanium/titanium nitride bilayer.

In step 115, the substrate is exposed to a first annealing process to form a first cobalt silicide layer during a first silicidation process. The first cobalt silicide compound contains substantially cobalt monosilicide (CoSi) that is formed as a reaction product between a portion of the metallic cobalt layer and silicon from the silicon-containing surface. The first annealing process heats the substrate to a temperature of about 600° C. or less, preferably, within a range from about 400° C. to about 600° C., such as about 500° C. The first annealing process heats the substrate for a time period within a range from about 10 seconds to about 60 seconds, preferably, from about 20 seconds to about 40 seconds, such as about 30 seconds. In one example, the substrate is annealed during a rapid thermal annealing (RTA) process, in an atmosphere of nitrogen gas at about 500° C. for about 30 seconds.

In step 120, the substrate is exposed to an etching process to remove the remaining portion of the metallic cobalt layer not consumed in the first silicidation process. The etching process may be a wet etch process such as a RCA, SC1, SC2, or SPM, which selectively etches the remaining metallic cobalt material.

In step 125, the substrate is exposed to a second annealing process to form a second cobalt silicide compound during a second silicidation process. The second cobalt silicide layer contains substantially cobalt disilicide ($CoSi_2$) that is formed as a reaction product between the first cobalt silicide compound and silicon from the silicon-containing surface. The second annealing process heats the substrate to a temperature of about 900° C. or less, preferably, within a range from about 600° C. to about 800° C., such as about 750° C. The second annealing process heats the substrate for a time period within a range from about 10 seconds to about 60 seconds, preferably, from about 20 seconds to about 40 seconds, such as about 30 seconds. The second cobalt silicide layer may be formed having a thickness within a range from about 100 Å to about 1,000 Å, preferably, from about 250 Å to about 800 Å, and more preferably, from about 350 Å to about 750 Å, such as about 550 Å. In one example, the substrate is annealed during a rapid thermal annealing (RTA) process, in an atmosphere of nitrogen gas at about 750° C. for about 30 seconds to form the second cobalt silicide has a thickness of about 540 Å.

In step 130, a fluorinated compound is formed on the substrate during a plasma process. In one example of a suitable cleaning method is that implemented in the SICONI™ chamber available from Applied Materials, Inc., of Santa Clara, Calif. Ammonia ($NH_3$) and nitrogen trifluoride ($NF_3$) may be mixed within a processing chamber containing a substrate to be cleaned. A plasma is used to dissociate the process gases, resulting in a chemical reaction at the substrate surface. Radio frequency power ranging from about 5 watts to about 600 watts may be used. Frequency less than about 100 kHz is preferable. Use of a plasma for cleaning enables the process to utilize low temperature, such as between about 15° C. and about 50° C. Typically, the process is maintained below room temperature by cooling the substrate support within the chamber. Chamber pressure is maintained below about 30 Torr, most preferably between about 3 Torr and about 6 Torr. The plasma-energized chemical reaction forms a fluorinated compound (e.g., ammonium hexafluorosilicate) on the surface of the substrate.

In step 135, the fluorinated compound may be removed from the substrate by a sublimation process. The fluorinated compound is removed by heating the substrate to a temperature between about 75° C. and about 250° C. Removal of the fluorinated compound has the effect of removing surface impurities, since many if not all of the surface impurities have been incorporated into the fluorinated compound. Heat may be provided by heating a portion of the process chamber, such as the distribution element above the substrate. The substrate may be positioned close to the heated distribution element for best results. In one embodiment, a distribution plate heated to a temperature of between about 100° C. and about 150° C. is sufficient to cause the film to dissociate into volatile components and sublime from the substrate.

In step 140, a metal nucleation layer, such as a titanium-containing nucleation layer may be deposited on the substrate. Instead of the titanium-containing nucleation layer, the metal nucleation layer may contain tantalum, tungsten, ruthenium, nitrides thereof, silicides thereof, derivates thereof, or combinations thereof. The metal nucleation layer may be deposited by a process, such as ALD, PE-ALD, CVD, PE-CVD, metallic-organic CVD (MOCVD), or PVD. The metal nucleation layer may be deposited having a thickness within a range from about 10 Å to about 250 Å, preferably, from about 25 Å to about 200 Å, and more preferably, from about 40 Å to about 125 Å, such as about 70 Å. In one example, the metal nucleation layer containing metallic titanium is deposited to a thickness of about 80 Å during a PVD process. In another example, the metal nucleation layer containing titanium nitride is deposited to a thickness of about 70 Å during a MOCVD process. In another example, the metal nucleation layer containing titanium nitride is deposited to a thickness of about 75 Å during a PVD process.

In step 145, a first aluminum layer is deposited over the metal nucleation layer by a CVD process. The first aluminum layer may be deposited by a process, such as CVD, MOCVD, or PE-CVD. The first aluminum layer may be deposited having a thickness within a range from about 10 Å to about 250 Å, preferably, from about 25 Å to about 200 Å, and more preferably, from about 50 Å to about 150 Å, such as about 100 Å. In one example, the first aluminum layer is deposited to a thickness of about 50 Å during a thermal CVD process. In another example, the first aluminum layer is deposited to a thickness of about 80 Å during a PE-CVD process. In another example, the first aluminum layer is deposited to a thickness of about 100 Å during a MOCVD process. In one embodiment, the metal nucleation layer which the first aluminum layer is deposited on to contains metallic titanium, titanium nitride, derivatives thereof, or combinations thereof.

In step 150, a second aluminum layer may be deposited over the first aluminum layer by a PVD process. The second aluminum layer may be deposited having a thickness of greater than 500 Å, such as within a range from about 500 Å to about 2,000 Å, preferably, from about 600 Å to about 1,500 Å, and more preferably, from about 700 Å to about 1,000 Å, such as about 900 Å. In one example, the second aluminum layer is deposited to a thickness of about 1,000 Å during a PVD process.

Figure 2:
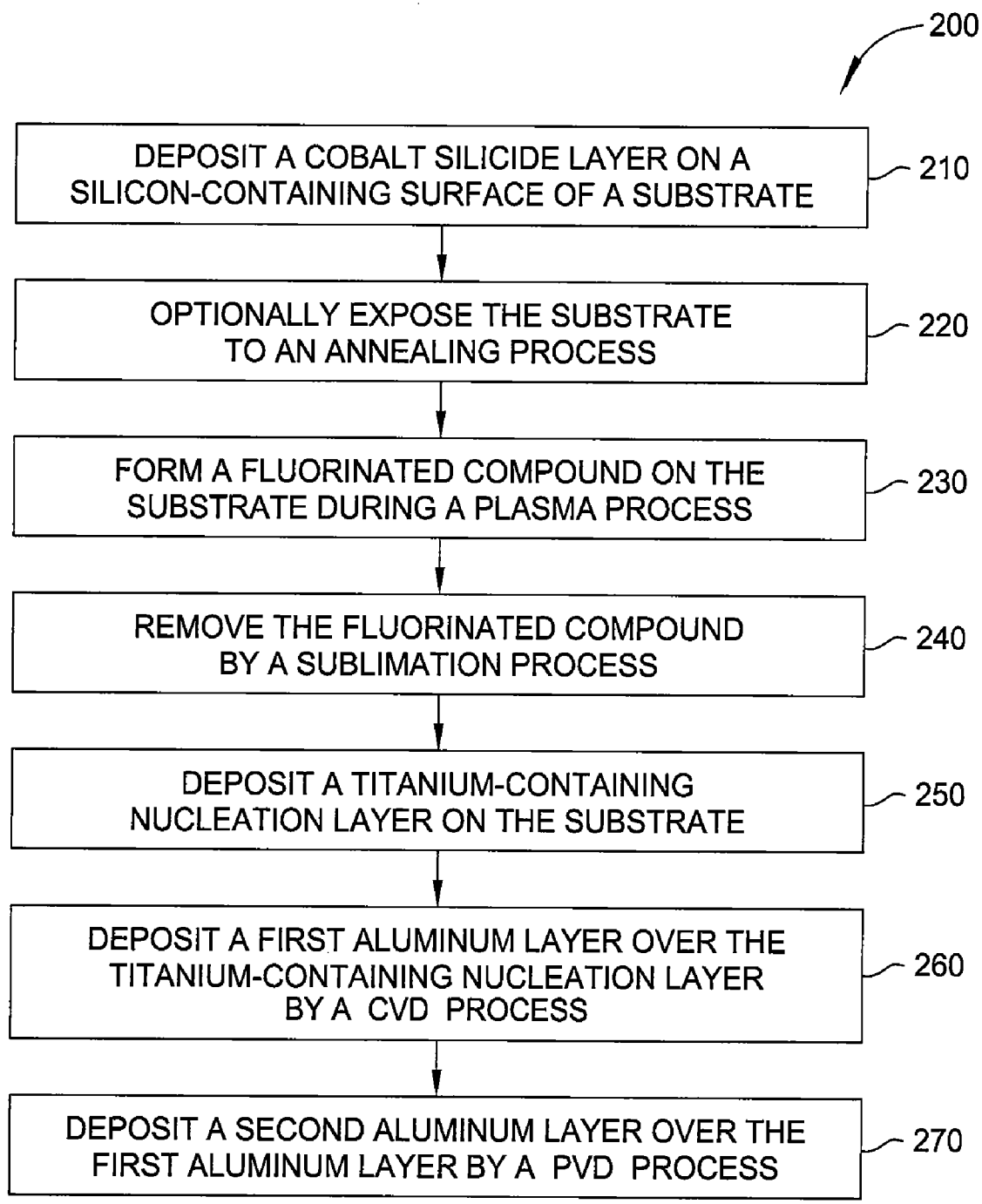
FIG. 2 depicts a flow chart of another process according to another embodiment described herein.

In another embodiment, a metal contact junction may be formed by using process 200, depicted in a flow chart by FIG. 2. In step 210, a cobalt silicide layer is deposited on a substrate. The cobalt silicide layer may be deposited by a process, such as silicidation, ALD, PE-ALD, CVD, PE-CVD, or PVD. The cobalt silicide layer may be deposited having a thickness within a range from about 100 Å to about 1,000 Å, preferably, from about 250 Å to about 800 Å, and more preferably, from about 350 Å to about 750 Å, such as about 550 Å. In one example, the cobalt silicide layer is deposited to a thickness of about 500 Å during an ALD process. In another example, the cobalt silicide layer is deposited to a thickness of about 600 Å during a CVD process. In another example, the cobalt silicide layer is deposited to a thickness of about 580 Å during a MOCVD process. In another example, the cobalt silicide layer is deposited to a thickness of about 520 Å during a PVD process.

In step 220, the substrate is optionally exposed to an annealing process. The annealing process heats the substrate to a temperature of about 900° C. or less, preferably, within a range from about 600° C. to about 800° C., such as about 750° C. The annealing process heats the substrate for a time period within a range from about 10 seconds to about 60 seconds, preferably, from about 20 seconds to about 40 seconds, such as about 30 seconds. In one example, the substrate is annealed during a RTA process, in an atmosphere of nitrogen gas at about 750° C. for about 30 seconds.

In step 230 a fluorinated compound is formed on the substrate during a plasma process. In one example of a suitable cleaning method is that implemented in the SICONI™ chamber available from Applied Materials, Inc., of Santa Clara, Calif. Ammonia and nitrogen trifluoride may be separately delivered and mixed within the processing chamber or reactor containing the substrate to be cleaned. Alternatively, a gaseous mixture of ammonia and nitrogen trifluoride may be delivered into the processing chamber. A plasma is used to dissociate the process gases, resulting in a chemical reaction at the substrate surface. Radio frequency power ranging from about 5 watts to about 600 watts may be used. Frequency less than about 100 kHz is preferable. Use of a plasma for cleaning enables the process to utilize low temperature, such as between about 15° C. and about 50° C. Typically, the process is maintained below room temperature by cooling the substrate support within the chamber. Chamber pressure is maintained below about 30 Torr, most preferably between about 3 Torr and about 6 Torr. The plasma-energized chemical reaction forms a fluorinated sublimation film which contains a fluorinated compound (e.g., ammonium hexafluorosilicate) on the surface of the substrate.

In step 240, the fluorinated sublimation film or the fluorinated compound may be removed from the substrate by a sublimation process. In one example, the fluorinated compound may be removed by heating the substrate to a temperature between about 75° C. and about 250° C. Removal of the fluorinated compound has the effect of removing surface impurities, since many if not all of the surface impurities have been incorporated into the fluorinated compound. Heat may be provided by heating a portion of the process chamber, such as the distribution element above the substrate. The substrate may be positioned close to the heated distribution element for best results. In one embodiment, a distribution plate heated to a temperature of between about 100° C. and about 150° C. is sufficient to cause the film to dissociate into volatile components and sublime from the substrate.

In step 250, a metal nucleation layer, such as a titanium-containing nucleation layer may be deposited on the substrate. Instead of the titanium-containing nucleation layer, the metal nucleation layer may contain tantalum, tungsten, ruthenium, nitrides thereof, suicides thereof, derivates thereof, or combinations thereof. The metal nucleation layer may be deposited by a process, such as ALD, PE-ALD, CVD, PE-CVD, MOCVD, or PVD. The metal nucleation layer may be deposited having a thickness within a range from about 10 Å to about 250 Å, preferably, from about 25 Å to about 200 Å, and more preferably, from about 40 Å to about 125 Å, such as about 70 Å. In one example, the metal nucleation layer containing metallic titanium is deposited to a thickness of about 80 Å during a PVD process. In another example, the metal nucleation layer containing titanium nitride is deposited to a thickness of about 70 Å during a MOCVD process. In another example, the metal nucleation layer containing titanium nitride is deposited to a thickness of about 75 Å during a PVD process.

In step 260, a first aluminum layer is deposited over the metal nucleation layer by a CVD process. The first aluminum layer may be deposited by a process, such as CVD, MOCVD, or PE-CVD. The first aluminum layer may be deposited having a thickness within a range from about 10 Å to about 250 Å, preferably, from about 25 Å to about 200 Å, and more preferably, from about 50 Å to about 150 Å, such as about 100 Å. In one example, the first aluminum layer is deposited to a thickness of about 50 Å during a thermal CVD process. In another example, the first aluminum layer is deposited to a thickness of about 80 Å during a PE-CVD process. In another example, the first aluminum layer is deposited to a thickness of about 100 Å during a MOCVD process. In one embodiment, the metal nucleation layer which the first aluminum layer is deposited on to contains metallic titanium, titanium nitride, derivatives thereof, or combinations thereof.

In step 270, a second aluminum layer may be deposited over the first aluminum layer by a PVD process. The second aluminum layer may be deposited having a thickness of greater than 500 Å, such as within a range from about 500 Å to about 2,000 Å, preferably, from about 600 Å to about 1,500 Å, and more preferably, from about 700 Å to about 1,000 Å, such as about 900 Å. In one example, the second aluminum layer is deposited to a thickness of about 1,000 Å during a PVD process.

A further disclosure of deposition processes for titanium-containing nucleation layers (steps 140 and 250) and the first and second aluminum layers (steps 145, 150, 260, and 270) may be found in commonly assigned U.S. Pat. Nos. 5,877,087, 5,989,633, 6,001,420, and 6,120,844, which are herein incorporated by reference.

In another embodiment, the cobalt silicide region on the surface of the silicon containing substrate may be formed by a silicidation process or a vapor deposition process. For example, a silicidation process may be used to form the cobalt suicide region. A silicidation process useful for this purpose may begin with deposition of a cobalt metal layer on a silicon-containing surface of a substrate. Such deposition may be performed by any means known to the art, such as PVD, CVD, or ALD processes. In one embodiment, the substrate is heated to a temperature of at least 100° C. during a CVD process, preferably to a temperature within a range from about 300° C. to about 400° C. In some examples, organic cobalt precursors such as conjugated cycloalkyl cobalt compounds may be used to deposit metallic cobalt on a substrate. In other examples, the cobalt precursor may be an alkyl cobalt carbonyl compound. In still other embodiments, a cobalt material with organic or nitrogenous ligands may be used. In some embodiments, plasma is also used, such as a plasma ignited by use of a radio frequency electric field at a frequency of about 13.56 MHz, to accelerate chemical reactions. The desired thickness of the deposited layer generally depends on the desired depth of the silicide region. A thick layer of metal may be deposited to form a deep junction, and a thin metal layer may be deposited to form a thin junction.

It is thought that the metal layer serves as a high metal concentration domain to drive a process of diffusion from the metal layer into the substrate. Diffusion may be promoted by thermal processes, which may employ a laser to focus heating at particular points on the substrate. As heat loosens the bonds between metal atoms and between substrate atoms, the metal atoms begin to diffuse into the substrate, generating dislocations in the lattice structure of the substrate in the process.

To repair the lattice damage caused by the dislocations, thereby hardening the doped lattice structure and reducing the possibility of dopant loss, the next step of the silicidation process generally involves annealing the substrate. In some embodiments, a capping layer may be used to protect the cobalt metal remaining on the surface of the substrate from oxidation during an annealing process. An annealing process such as RTA may be used. Rapid thermal annealing imparts enough heat to the substrate to encourage redistribution of atoms in the lattice without driving dopant atoms out of the lattice altogether. Two different compounds of cobalt silicide may be formed during the annealing process. A first silicide compound containing cobalt monosilicide (CoSi) may be formed at a temperature of about 500° C. The monosilicide phase is characterized by highly random arrangement of atoms. A second silicide compound containing cobalt disilicide ($CoSi_2$) may be formed at a temperature of about 600° C. or greater.

One method of silicidation involves annealing at about 500° C. for a time selected to form a silicide region to a desired depth, such as about 30 seconds. Remaining metal may then be removed by wet etch to prevent further metal incorporation and deepening of the region. Subsequently, a second anneal at a temperature of about 600° C. or greater may be performed to complete the process. In one example, the substrate may be heated at about 500° C. for about 30 seconds and then heated at about 600° C. or greater for about 30 seconds to form a silicide region with a thickness of about 540 Å. Annealing in two steps may also result in more uniform crystal structure and better mechanical strength of the silicide region.

A silicidation process may be performed with metals useful for doping the source and drain junction of a semiconductor device. Metal layers may be deposited using ALD or CVD processes, with or without plasma. Various compositions may be used for a capping layer, and the capping layer may also be omitted. Nitrides, carbides, oxynitrides, and oxycarbides of metals and semiconductors, such as titanium nitride, silicon nitride, silicon carbide, and silicon oxynitride are popular compositions for capping layers. Also, many annealing regime designed to produce the desired cobalt silicide compound and arrangement of silicide may be used. The processes described by embodiments herein are well-suited for the integration of an aluminum contact with a cobalt silicide surface.

In another embodiment, the substrate may be subjected to a cleaning step prior to formation of the cobalt silicide layer. A cleaning step may be used to remove oxidized material from the surface of the substrate, exposing silicon. Cleaning may be performed by a wet etch process, such as exposure to a hydrofluoric acid solution, or by a plasma cleaning process, such as exposure to a plasmas of an inert gas or reducing gas.

The substrate may be cleaned again after siliciding. An example of a suitable cleaning method is that implemented in the SICONI™ chamber available from Applied Materials, Inc., of Santa Clara, Calif. Ammonia and nitrogen trifluoride may be mixed within a processing chamber containing a substrate to be cleaned. A plasma is used to dissociate the process gases, resulting in a chemical reaction at the substrate surface. Radio frequency power ranging from about 5 watts to about 600 watts may be used. Frequency less than about 100 kHz is preferable. Use of a plasma for cleaning enables the process to utilize low temperature, such as between about 15° C. and about 50° C. Typically, the process is maintained below room temperature by cooling the substrate support within the chamber. Chamber pressure is maintained below about 30 Torr, most preferably between about 3 Torr and about 6 Torr.

The plasma-energized chemical reaction forms a volatile film of ammonium hexafluorosilicate on the surface of the substrate. The film is removed by heating the substrate to a temperature between about 75° C. and about 250° C. Removal of the film has the effect of removing surface impurities. Heat may be provided by heating a portion of the process chamber, such as the distribution element above the substrate. The substrate may be positioned close to the heated distribution element for best results. In one embodiment, a distribution plate heated to a temperature of between about 100° C. and about 150° C. is sufficient to cause the film to dissociate into volatile components and sublime from the substrate.

A nucleation layer may be used to facilitate formation of a metal contact layer on a substrate. In some embodiments, a substrate cleaned according to the process briefly described above is subjected to a deposition process to form a nucleation layer. The deposition process may be a PVD process. A layer of metal, metal nitride, or metal oxynitride may be used to provide a nucleation surface for subsequent formation of a metal layer. If such a layer is used, thickness of the layer is preferably less than about 150 Å, most preferably about 100 Å or less. In one embodiment, for example, a layer of titanium metal with a thickness of about 30 Å is deposited by PVD, followed by two layers of titanium nitride with a thickness of about 35 Å each deposited by CVD. Deposition of a nucleation layer may begin with deposition of a metal seed layer by various processes, such as PVD, CVD, or ALD, with or without plasma enhancement. A nitride or oxynitride layer may then be formed in either a single deposition step or a repeated cyclical deposition. A CVD process may be used with one or more nitrogen-, oxygen-, or metal-containing precursors provided to a process chamber. Plasma may be used to enhance the deposition process. The nucleation layer may be annealed with or without plasma to enhance hardness and adhesion.

A metal contact may be formed either directly on the cobalt silicide layer or over a nucleation layer. Use of a nucleation layer promotes formation of the metal layer. A thin nucleation layer may promote formation of the metal contact without sacrificing conductivity at the interface. In one embodiment, the nucleation layer has a thickness less than about 150 Å. The metal contact layer may be formed by various processes, such as ALD, PVD, or CVD, and may be enhanced by presence of a plasma. In one embodiment, a thin seed layer of metal, such as aluminum, may be deposited by CVD, and then a bulk layer may be deposited on the seed layer by PVD.

Figure 3:
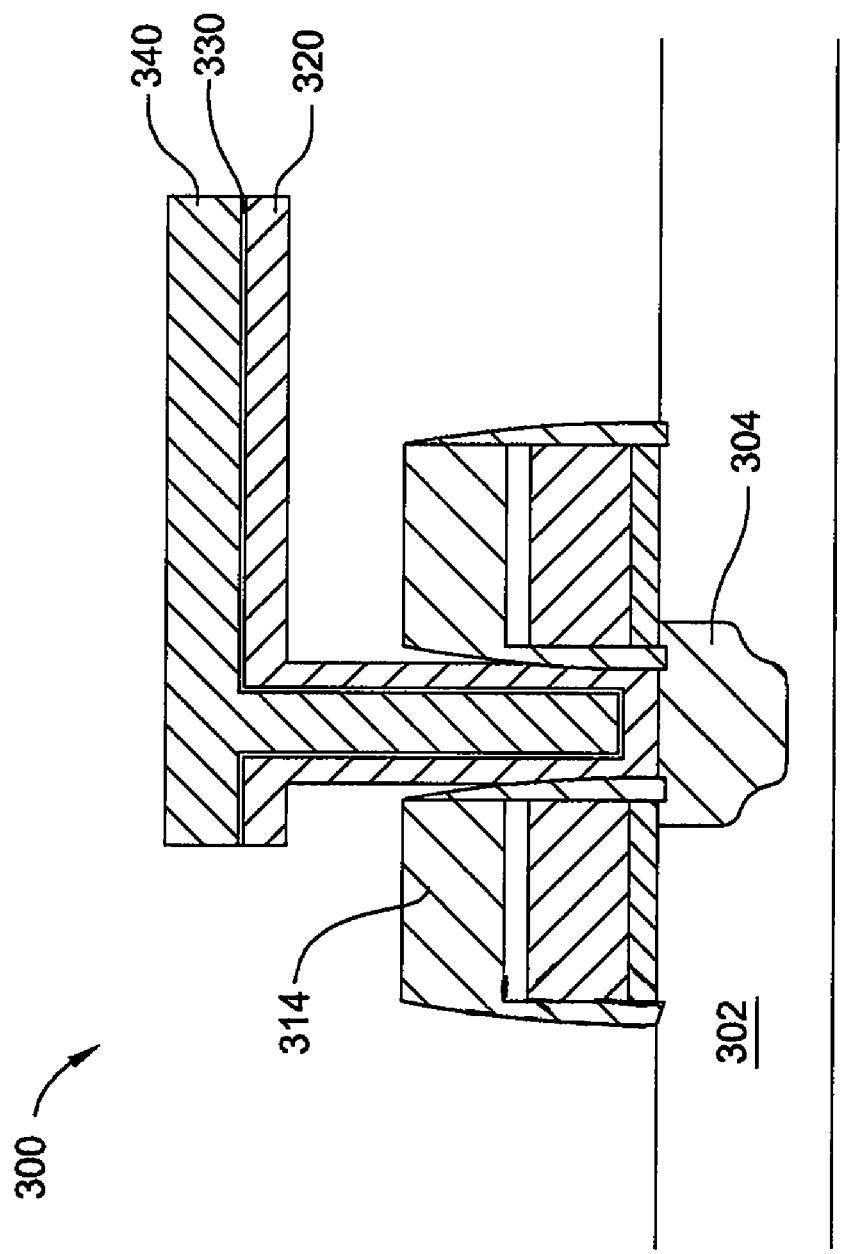
FIG. 3 depicts a cobalt silicide junction according to an embodiment described herein.

In another embodiment, cobalt silicide materials, formed by processes 100 and 200 described herein, may be used as cobalt silicide junctions, such as cobalt silicide junction 304 on substrate 300 as depicted in FIG. 3. Substrate 300 contains gate structures 314 disposed on underlayer 302. Underlayer 302 may be a substrate or a wafer, or may be a layer deposited on the substrate, such as a silicon-containing layer. In one example, cobalt silicide junction 304 may be formed on substrate 300 during steps 105, 110, 115, 120, and 125 of process 100. In another example, cobalt silicide junction 304 may be formed on substrate 300 during steps 210 and 220 of process 200.

Substrate 300 contains nucleation layer 320 formed on or over cobalt silicide junction 304 and in between gate structures 314. Nucleation layer 320 may contain a single layer or multiple layers of metal-containing materials. In some examples, nucleation layer 320 contains titanium-containing material, such as metallic titanium, titanium nitride, titanium silicide nitride, alloys thereof, or derivatives thereof. In some embodiments, nucleation layer 320 may be a titanium-containing nucleation layer deposited as described in step 140 of process 100 or in step 250 of process 200. In one example, nucleation layer 320 contains metallic titanium, titanium nitride, or a stack containing a metallic titanium and a titanium nitride layer.

Substrate 300 further contains aluminum layer 330 deposited on or over nucleation layer 320 and aluminum layer 340 deposited on or over aluminum layer 330. Aluminum layers 330 and 340 may be deposited by the same or different deposition processes. In a preferred embodiment, aluminum layer 330 is deposited by a CVD process and aluminum layer 340 is deposited by a PVD process. In some examples, aluminum layer 330 and aluminum layer 340 may each independently contain aluminum, an aluminum alloy, or derivatives thereof. In one example, aluminum layer 330 may be deposited by a CVD process as described in step 145 of process 100 or in step 260 of process 200. In another example, aluminum layer 340 may be deposited by a PVD process as described in step 150 of process 100 or in step 270 of process 200.

Figure 4:
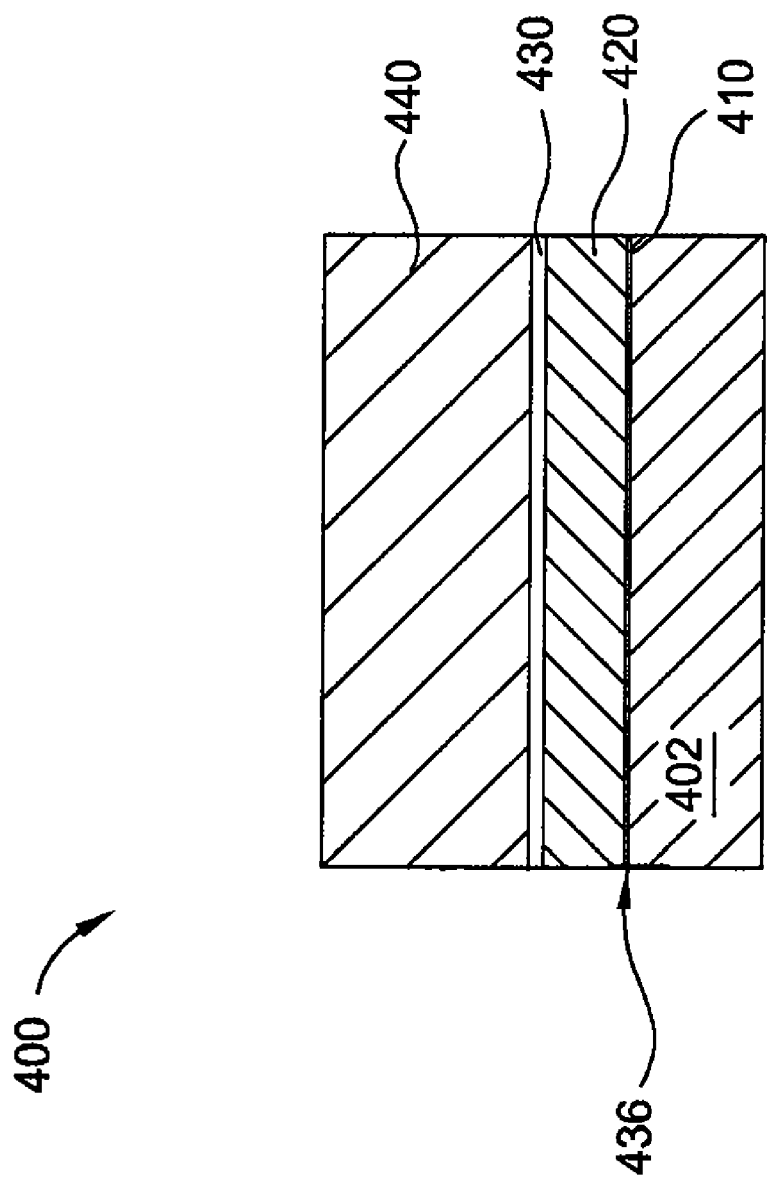
FIG. 4 depicts a cobalt silicide layer according to another embodiment described herein.

In another embodiment, cobalt silicide materials, formed by processes 100 and 200 described herein, may be used as cobalt silicide layers, such as cobalt silicide layer 436 on substrate 400 as depicted in FIG. 4. Substrate 400 contains underlayer 402 which may be a substrate or a wafer, or may be a layer deposited on the substrate, such as a silicon-containing layer. In one example, cobalt silicide layer 436 may be formed on substrate 400 during steps 105, 110, 115, 120, and 125 of process 100. In another example, cobalt silicide layer 436 may be formed on substrate 400 during steps 210 and 220 of process 200.

Substrate 400 contains nucleation layers 410 and 420 formed or deposited on or over cobalt silicide layer 436. Nucleation layers 410 and 420 may contain titanium-containing material, such as metallic titanium, titanium nitride, titanium silicide nitride, alloys thereof, or derivatives thereof. Nucleation layer 410 and nucleation layer 420 may each independently contain a single layer or multiple layers of metal-containing materials. In some embodiments, nucleation layers 410 and 420 may be titanium-containing nucleation layers deposited as described in step 140 of process 100 or in step 250 of process 200. In one example, nucleation layer 410 contains metallic titanium which may be deposited by a PVD process, an ALD process, or a CVD process. In another example, nucleation layer 420 contains two layers of titanium nitride deposited by a PVD process, an ALD process, or a CVD process.

Substrate 400 further contains aluminum layer 430 deposited on or over nucleation layer 420 and aluminum layer 440 deposited on or over aluminum layer 430. Aluminum layers 430 and 440 may be deposited by the same or different deposition processes. In a preferred embodiment, aluminum layer 430 is deposited by a CVD process and aluminum layer 440 is deposited by a PVD process. In some examples, aluminum layer 430 and aluminum layer 440 may each independently contain aluminum, an aluminum alloy, or derivatives thereof. In one example, aluminum layer 430 may be deposited by a CVD process as described in step 145 of process 100 or in step 260 of process 200. In another example, aluminum layer 440 may be deposited by a PVD process as described in step 150 of process 100 or in step 270 of process 200.

While the foregoing is directed to embodiments of the invention, other and further embodiments of the invention may be devised without departing from the basic scope thereof, and the scope thereof is determined by the claims that follow.

The invention claimed is:

1. A method for depositing materials on a substrate, comprising:
    forming a cobalt silicide layer on a silicon-containing surface of a substrate during a silicidation process, wherein forming the cobalt silicide layer comprises:
        depositing a cobalt-containing layer on the silicon-containing surface of the substrate;
        heating the substrate to a first temperature to form cobalt silicide during a first rapid thermal annealing process;
        substantially removing any remaining portions of the cobalt-containing layer from the substrate during an etching process; and
        heating the substrate to a second temperature during a second rapid thermal annealing process;
    forming a fluorinated sublimation film on the cobalt silicide layer during a plasma process;
    heating the substrate to a sublimation temperature to remove the fluorinated sublimation film;
    depositing a titanium-containing nucleation layer on the cobalt silicide layer, wherein depositing the titanium-containing nucleation layer comprises:
        depositing a metallic titanium layer on the cobalt silicide layer during a vapor deposition process;
        depositing a first titanium nitride layer on the metallic titanium layer during a first chemical vapor deposition process;
        exposing the first titanium nitride layer to a first inert gas plasma;
        depositing a second titanium nitride layer on the first titanium nitride layer during a second chemical vapor deposition process; and
        exposing the second titanium nitride layer to a second inert gas plasma; and
    depositing an aluminum material on the titanium-containing nucleation layer, wherein depositing the aluminum material over the titanium-containing nucleation layer comprises:
        depositing a first aluminum-containing layer over the titanium-containing nucleation layer during a chemical vapor deposition process, wherein the first aluminum-containing layer is deposited by exposing the substrate to an organic-metallic aluminum precursor during the chemical vapor deposition process; and
        depositing a second aluminum-containing layer over the first aluminum-containing layer.

2. A method for depositing materials on a substrate, comprising:
    forming a cobalt silicide layer on a silicon-surface of a substrate;
    forming a fluorinated sublimation film on the cobalt silicide layer during a plasma cleaning process;
    heating the substrate to sublime the fluorinated sublimation film;
    depositing a titanium-containing nucleation layer over the cobalt silicide layer during a deposition process, further comprising:
        depositing a metallic titanium layer on the cobalt silicide layer, wherein the metallic titanium layer has a thickness of about 50 Å or less;
        depositing a first titanium nitride layer on the metallic titanium layer, wherein the first titanium nitride layer has a thickness of about 50 Å or less;
        exposing the first titanium nitride layer to a first inert gas plasma;
        depositing a second titanium nitride layer on the first titanium nitride layer, wherein the second titanium nitride layer has a thickness of about 50 Å or less; and
        exposing the second titanium nitride layer to a second inert gas plasma;
    depositing an aluminum seed layer over the titanium-containing nucleation layer during a chemical vapor deposition process, wherein the aluminum seed layer is deposited by exposing the substrate to an organic-metallic aluminum precursor during the chemical vapor deposition process; and
    depositing an aluminum bulk layer over the aluminum seed layer during a second physical vapor deposition process.

3. The method of claim 2, wherein the cobalt silicide layer is formed during a silicidation process.

4. The method of claim 2, wherein the cobalt silicide layer is formed during a chemical vapor deposition process or a physical vapor deposition process.

5. The method of claim 2, wherein the metallic titanium layer has a thickness of about 30 Å, the first titanium nitride layer has a thickness of about 35 Å, and the second titanium nitride layer has a thickness of about 35 Å.

* * * * *

UNITED STATES PATENT AND TRADEMARK OFFICE
CERTIFICATE OF CORRECTION

Page 1 of 1

PATENT NO. : 7,867,900 B2
APPLICATION NO. : 12/240816
DATED : January 11, 2011
INVENTOR(S) : Lee et al.

It is certified that error appears in the above-identified patent and that said Letters Patent is hereby corrected as shown below:

Title Page;

In the References Cited (56):

Please insert --Lee, et al. "Excellent conformal deposition obtained of pure Co Films by MOCVD using $Co_2(CO)_B$ as a Co precursor," http:/www.samsung.com/AboutSAMSUNG.ELECTRONICSGLOBAL/SocialCommitment/HumantechThese/WinningPapers/downloads/11$^{th}$/silverproze/LeeJeongGil.pdf--;

In the Detailed Description:

Column 3, Line 34, please delete "suicide" and insert --silicide-- therefor;

Column 3, Line 66, please delete "suicides" and insert --silicides-- therefor;

Column 7, Line 5, please delete "suicides" and insert --silicides-- therefor;

Column 7, Line 55, please delete "suicide" and insert --silicide-- therefor.

Signed and Sealed this
Fifth Day of April, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,867,900 B2 | Page 1 of 1 |
| APPLICATION NO. | : 12/240816 | |
| DATED | : January 11, 2011 | |
| INVENTOR(S) | : Lee et al. | |

It is certified that error appears in the above-identified patent and that said Letters Patent is hereby corrected as shown below:

Title Page;

In the References Cited (56):

Please insert --Lee, et al. "Excellent conformal deposition obtained of pure Co Films by MOCVD using $Co_2(CO)_8$ as a Co precursor," http:/www.samsung.com/AboutSAMSUNG.ELECTRONICSGLOBAL/SocialCommitment/HumantechThese/WinningPapers/downloads/11th/silverproze/LeeJeongGil.pdf--;

In the Detailed Description:

Column 3, Line 34, please delete "suicide" and insert --silicide-- therefor;

Column 3, Line 66, please delete "suicides" and insert --silicides-- therefor;

Column 7, Line 5, please delete "suicides" and insert --silicides-- therefor;

Column 7, Line 55, please delete "suicide" and insert --silicide-- therefor.

This certificate supersedes the Certificate of Correction issued April 5, 2011.

Signed and Sealed this
Twenty-fourth Day of May, 2011

David J. Kappos
*Director of the United States Patent and Trademark Office*